United States Patent [19]
Gomi

[11] Patent Number: 5,861,640
[45] Date of Patent: Jan. 19, 1999

[54] MESA BIPOLAR TRANSISTOR WITH SUB BASE LAYER

[75] Inventor: Takayuki Gomi, Tokyo, Japan

[73] Assignee: Sony Corporation, Tokyo, Japan

[21] Appl. No.: 786,080

[22] Filed: Jan. 17, 1997

[30] Foreign Application Priority Data

Jan. 19, 1996 [JP] Japan ................................. 8-007028

[51] Int. Cl.[6] ...................... H01L 27/082; H01L 27/102; H01L 29/70; H01L 31/11
[52] U.S. Cl. ................... 257/197; 257/198; 257/554; 257/571; 257/588; 257/592
[58] Field of Search ........................... 257/197, 198, 257/571, 588, 592, 554

[56] References Cited

U.S. PATENT DOCUMENTS

| | | | |
|---|---|---|---|
| 4,883,772 | 11/1989 | Cleeves et al. | 257/588 |
| 4,887,145 | 12/1989 | Washio et al. | 257/514 |
| 5,346,840 | 9/1994 | Fujioka | 437/31 |

*Primary Examiner*—William Mintel
*Attorney, Agent, or Firm*—Hill & Simpson

[57] ABSTRACT

A mesa bipolar transistor comprising a collector layer formed on a surface of a substrate, a base layer disposed on the substrate so as to be joined to the collector layer, an emitter layer disposed on the base layer is further provided with a sub base layer comprising at least one of a polysilicon layer containing impurities, a metallic silicide, and a diffused layer formed on the surface of the substrate and being disposed under or on the external base region which is a region of the base layer lateral to that under the emitter layer so that the thickness of the external base region is increased to provide high conductivity.

10 Claims, 13 Drawing Sheets

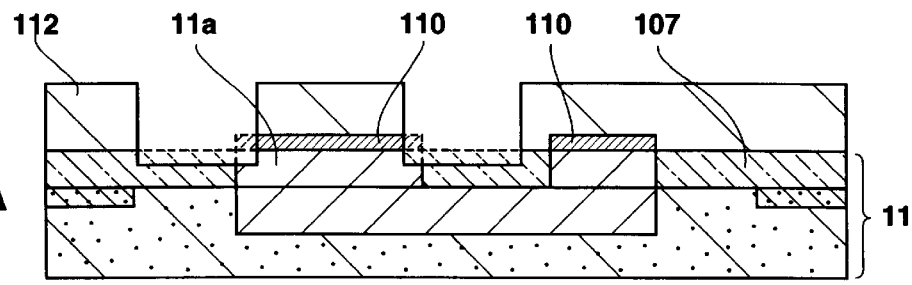
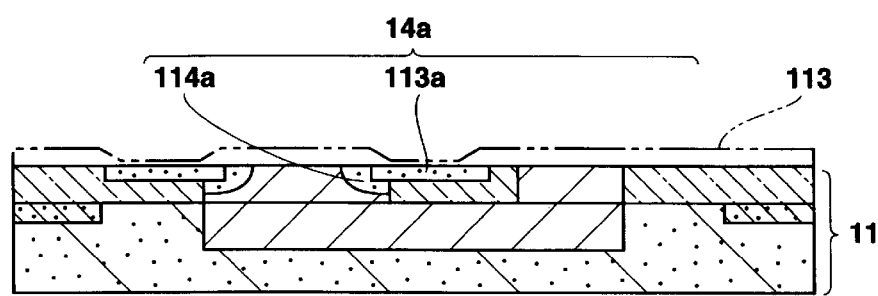
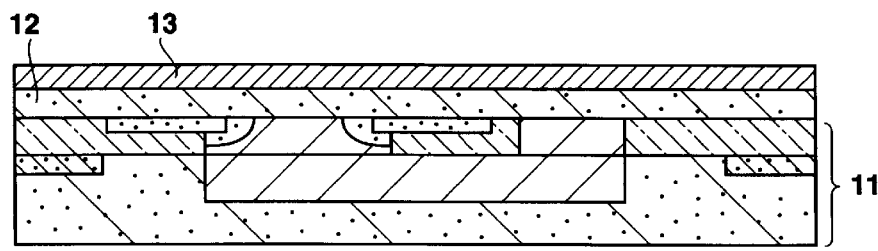
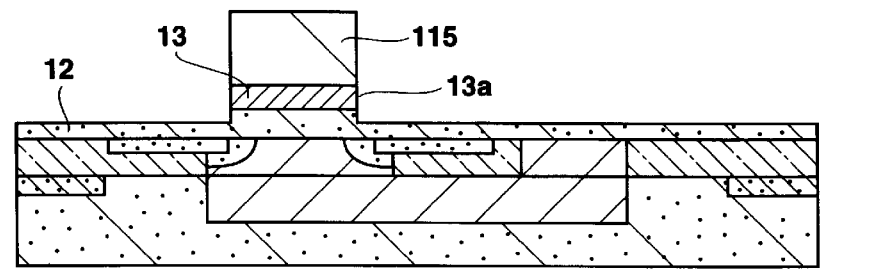
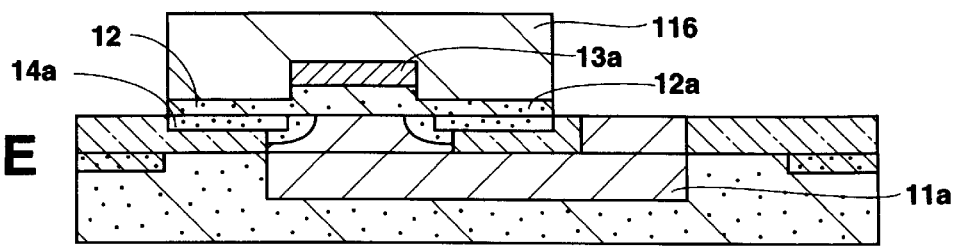

4    44a

MESA BIPOLAR TRANSISTOR WITH SUB BASE LAYER

BACKGROUND OF THE INVENTION

This invention relates to a bipolar transistor, and more particularly to a mesa bipolar transistor provided with a base layer formed by patterning semiconductor layers laminated by epitaxial growth; and an emitter layer.

In order to enhance operating speed of a bipolar transistor, the maximum cut-off frequency of the bipolar transistor (hereinafter referred to as fTmax) must be raised by narrowing the base width. If the base width is narrowed, however, the emitter-collector withstand voltage is lowered and punch-through occurs easily. To prevent this while the fTmax value is increased, therefore, the bipolar transistor must be provided with a base layer in which impurities are diffused densely and shallowly. Generally, for such the base layer, an impurity diffusion layer has been used. The diffusion layer is formed by implanting impurities in it with the ion implantation method. Ion implantation cannot make the impurity diffusion layer shallow because of channeling. For the bipolar transistor having a base layer formed such way, the upper limit of fTmax was 30 to 40 GHz.

To solve this problem, another bipolar transistor was proposed. The transistor used a base layer comprising a semiconductor layer formed by epitaxial growth. This bipolar transistor is formed as described below.

At first, as shown in FIG. 1A, a P-type impurity-contained silicon film is epitaxial-grown as a first semiconductor layer 12 on a substrate 11 having an N-type collector layer 11a formed on the surface. Then, on the surface of the first semiconductor layer 12 is epitaxial-grown an N-type impurity-contained silicon film as second semiconductor layer 13. After this, as shown in FIG. 1B, a resist pattern 901 is used as a mask for etching the second semiconductor layer 13 to form an emitter layer 13a comprising the second semiconductor 13. Then, the resist pattern 901 is removed and a resist pattern 902 is used as a mask for etching the first semiconductor layer 12 as shown in FIG. 1C to form a base layer 12a comprising the first semiconductor layer 12 under the emitter layer 13a. Subsequently, as shown in FIG. 1D, an insulating film 18 is formed on the substrate 11 so that the film may cover both emitter layer 13a and base layer 12a. Then, contact holes 18a are formed in the insulating film 18 so that the holes 18a may reach the collector layer 11a, the base layer 12a, and the emitter layer 13a, respectively. Finally, a wiring 19 is formed so that the wire may be connected to each of the above layers.

Compared with the transistor whose base layer is formed by ion implantation, a bipolar transistor 9 formed in such way is provided with a base layer 12a in which impurities are diffused more densely and shallowly. It is reported that the fTmax can be reached to around 50 GHz in this case.

The base layer 12a may also be formed by patterning the first semiconductor comprising an impurity-contained Si—Ge (silicon-germanium: SiGex) film. Compared with the bipolar transistor formed only with silicon, the hetero bipolar transistor having such a base layer 12a has a narrower base band gap, so the emitter density can be set lower. This is why both hFE drop caused by band gap narrowing and emitter-base withstand voltage drop can be prevented. In the hetero bipolar transistor in such a configuration, it is reported that fTmax can reach around 100 GHz.

In recent years, semiconductors are highly integrated and their functions are enhanced rapidly. Also in the data communication field, smaller communication devices and higher communication speed are demanded more and more accordingly. To achieve such demands, it is necessary to form the elements that can operate as fast (fTmax=120 GHz) as those formed with Ga—As (gallium-arsentic) on the object silicon substrate and package those elements in an IC. Making each of the above mentioned bipolar transistors practicable is thus strongly desired.

However, the following problems had to be solved to put such a bipolar transistor to practical use.

In other words, as shown in FIG. 1B, the above mentioned emitter layer 13a was patterned on the first semiconductor layer 12 used as a base layer. This is why when patterning the emitter 13a, over-etching of the base layer (first semiconductor layer 12) exposed out of the emitter layer 13a cannot be avoided. Consequently, as shown in FIG. 1C, in the base layer 12a, the film of the base region other than the intrinsic base region B just under the emitter layer 13a, that is, the external base region A, becomes thinner than that of the base region B and this makes the base resistance higher.

Increasing of the base resistance caused by this over-etching becomes more apparent when the base layer is thinner. This prevents the IC elements from being operated with high speed.

SUMMARY OF THE INVENTION

To solve the above mentioned problem, the bipolar transistor of this invention is a mesa bipolar transistor which comprises a collector layer, a base layer, an emitter layer, and a sub base layer. The collector layer is formed on a surface of a substrate, the base layer is disposed on the substrate so as to be joined to the collector layer, and the emitter layer is disposed on the base layer.

The base layer has an external base region as a region lateral to that under the emitter layer, and the sub base layer is disposed under or on the external base region. One end of the sub base layer under the external base region may be disposed under the emitter layer and one end on the external base region may be disposed on the collector layer disposed under the base layer.

The base layer can be comprised of a compound semiconductor of silicon and germanium. The sub base layer comprises at least one of a polysilicon layer containing impurities, a metallic silicide, and a diffused layer formed on a surface layer of the substrate, or it may be comprised of a metallic silicide in a state being insulated from the emitter layer when disposed on the external base region.

In the bipolar transistor mentioned above, since a sub base layer is formed under or on the external base region, the actual thickness of the external base region film becomes the total of those of the external base region and sub base region films. Consequently, even when base resistance of the external base region increases because of the thinned film of the whole base layer, this increase can be prevented by the additional sub base layers formed under or on the external base region.

Furthermore, since one end of the sub base layer under the external base region is disposed under the emitter layer, the sub base layer is disposed without any gap from the intrinsic base region under the emitter layer to the external base region so that base resistance can be further prevented from rising.

In addition, the sub base layer on the external base region is disposed on the collector layer under the base layer, so the single crystal portion of the base layer on the collector layer is connected to the sub base layer. As a result, base resistance can be suppressed lower.

BRIEF DESCRIPTION OF THE DRAWINGS

FIG. 4A through FIG. 4E are cross sectional views showing a manufacturing process of the bipolar transistor in the first embodiment.

DETAILED DESCRIPTION OF THE PREFERRED EMBODIMENTS

Figure 1A:
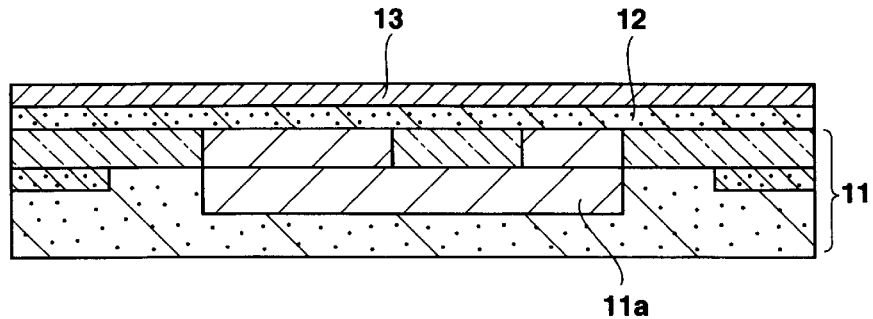
FIGS. 1A through 1D are cross sectional views showing a manufacturing process of a related art bipolar transistor.
Figure 1B:
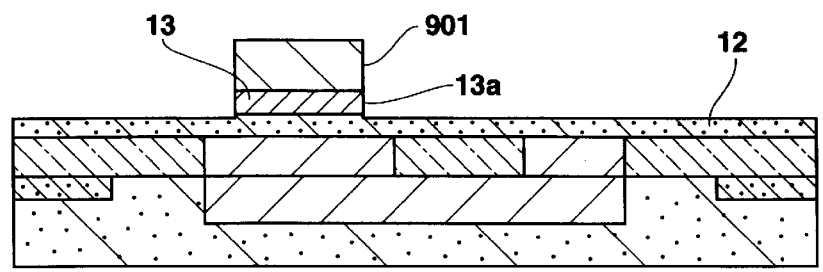
Figure 1C:
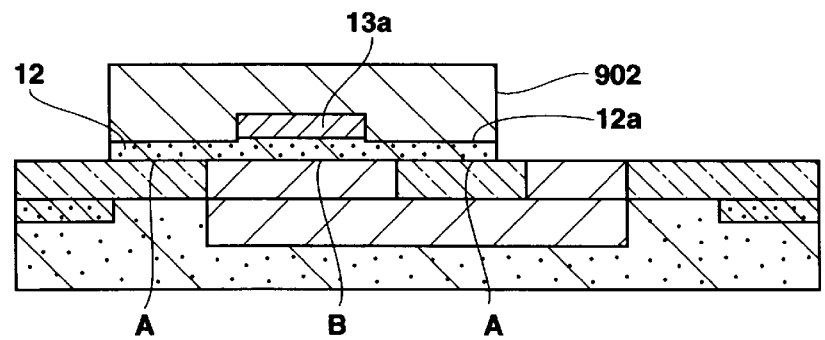
Figure 1D:
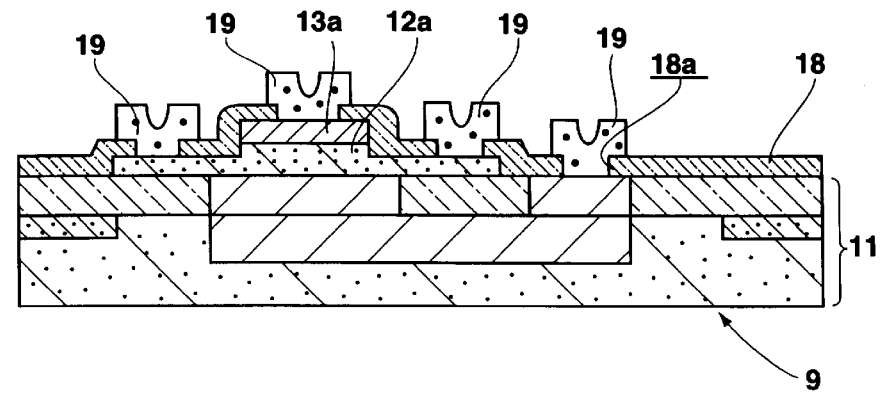

Hereunder, the embodiments (first through eighth) for the bipolar transistor of this invention will be described sequentially.

In each embodiment, like reference numerals or characters designate like parts with omission of repetition of explanation. In each of the following embodiments, an NPN bipolar transistor will be taken as an example for explanation, but this invention is also applicable for PNP bipolar transistors. In this case, however, the dielectric type in the explanation must be reversed.

Figure 2:
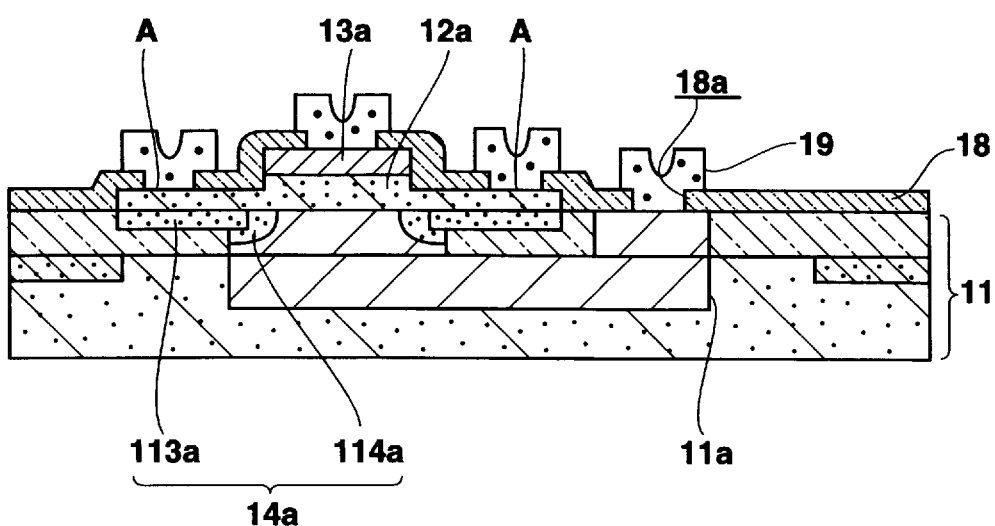
FIG. 2 is a cross sectional view of the bipolar transistor in the first embodiment of the present invention.

FIG. 2 shows the bipolar transistor 1 in the first embodiment. This bipolar transistor 1 is a mesa one provided with an N-type collector layer 11a formed on the <100> surface of the substrate 11; a P-type base layer 12a formed on the substrate 11 and joined to this collector layer 11; and an N-type emitter layer 13a formed on the base layer 12a. Under the external base region A lateral to the base layer 12a under the emitter 13a is disposed a sub base layer 14a. This sub base layer 14a comprises a polysilicon layer 113a and a diffused layer 114a. The polysilicon layer 113a is made of polysilicon containing P-type impurities with a high concentration of $10^{19}$ to $10^{21}$ cm$^{-3}$. The diffusion layer 114a is made of silicon single crystal containing P-type impurities with a high concentration of about $10^{19}$ to $10^{21}$ cm$^{-3}$.

Hereunder, manufacturing process of the bipolar transistor 1 will be described with reference to FIGS. 3A through 3E, and 4A through 4D.

Figure 3A:
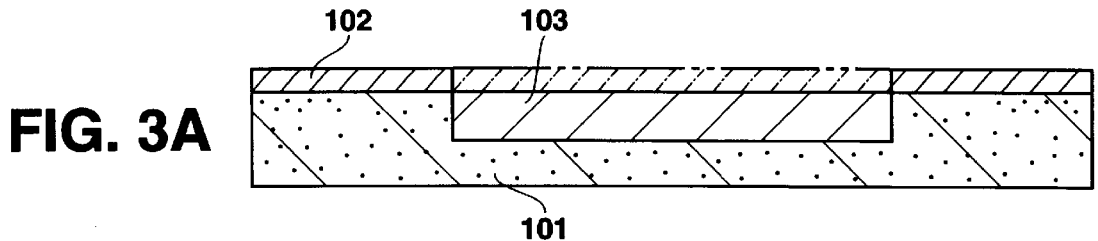
FIG. 3A through FIG. 3E are cross sectional views showing a manufacturing process of the bipolar transistor of present invention.

At first, an oxidized silicon film 102 whose thickness is about 300 nm is formed by thermal oxidation on the surface of a P-type silicon substrate 101 as shown in FIG. 3A.

Then, a resist pattern (not shown here) is used as a mask for etching and removing the oxidized silicon film 102 where the bipolar transistor 1 is to be formed.

After this, antimony is diffused in the surface layer of the silicon substrate 101 from where the oxidized silicon film 102 was removed by vapor phase diffusion using oxidized antimony ($Sb_2O_3$) as a solid diffusion source to form an N-type embedded collector layer 103. In this case, diffusion must be carried out so that the embedded collector layer 103 may have the sheet resistance of ρs=20 to 50 Ω/□, with a depth Xj=1 to 2 μm.

Figure 3B:
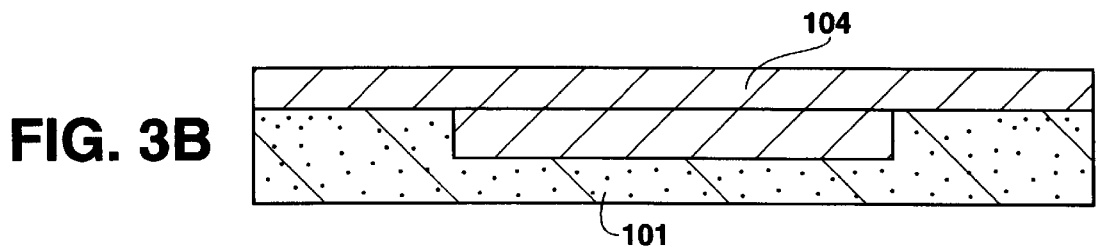

Subsequently, as shown in FIG. 3B, the silicon oxide film (102) is removed, then an N-type semiconductor layer 104 is formed on the silicon substrate 101 using the epitaxial technology so that the layer 104 has a specific resistance of 0.3 to 5.0 Ωcm and a thickness of 0.7 to 2.0 μm.

Figure 3C:
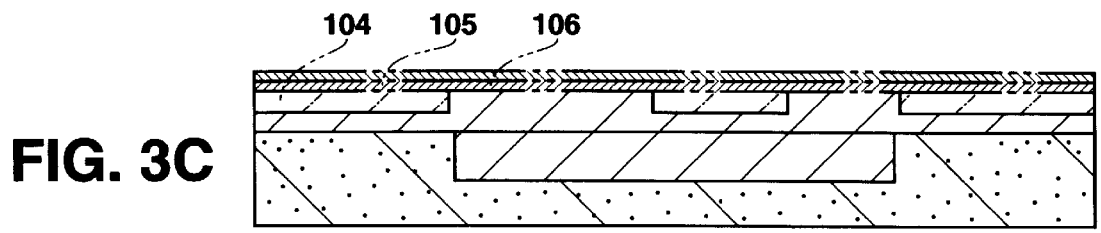

After this, the surface of the N-type semiconductor layer 104 is oxidized to form a buffer oxide film 105 as shown in FIG. 3C and a silicon nitride film 106 is formed on the surface of this buffer oxide film 105 using the vacuum CVD (Chemical Vapor Deposition) process. The thickness of those films is determined by the length of the bird's beak of the LOCOS (Local Oxidation of Silicon) oxidized film to be formed later and the controllability of suppressing the stress and fault generated by LOCOS oxidation. For example, the buffer oxide film 105 is set to 20 to 50 nm and the silicon nitride film 106 is set to 50 to 100 nm. Then, the resist pattern (not shown here) is used as a mask for etching to remove the silicon nitride film 106 and the buffer oxide film 105 from the region on which LOCOS oxidation is to be carried out. Furthermore, an N-type semiconductor 104 is etched down to about ½ of the LOCOS oxide film in thickness. With this, the surface of the substrate is planarized after the LOCOS oxidized film is formed.

Figure 3D:
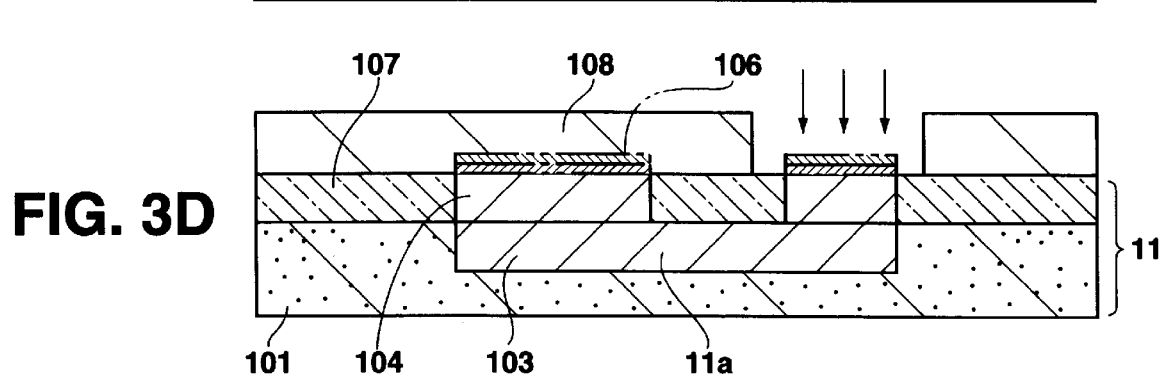

Subsequently, as shown in FIG. 3D, a LOCOS-oxidized film 107 is grown on the surface of the semiconductor layer 104 exposed out of the silicon nitride film 106 with a thickness of about 0.8 to 1.5 μm by steaming oxidation for 2 to 6 hours at a temperature of 1000° to 1050° C. In this process, an N-type collector layer 11a is formed with a portion of the semiconductor layer 104 remained unoxidized in the LOCOS oxidation and the embedded collector layer 103. Thus, the substrate 11 is formed which comprises a silicon substrate 101, a collector layer 11a and a LOCOS-oxidized film 107.

After this, wet-etching is carried out using thermal phosphoric acid to remove the silicon nitride film 106, then a resist pattern 108 is formed for providing opening on an external connection region of the collector 11a. This resist pattern 108 is used as a mask for ion implantation of N-type impurities into the collector layer 11a to form the external connection region on the surface. In this case, phosphorus is used as N-type impurities and implanted with a concentration of $10^{15}$ to $10^{16}$ cm$^{-3}$ using 40 to 100 keV implanting energy.

Consequently, the resist pattern 108 is removed and an oxide film (not shown here) is formed with the CVD method with a thickness of 100 to 600 nm. Then, activating annealing is carried out for the phosphorus implanted in the surface layer of the substrate 11 by the ion implantation mentioned above. Then, a resist film (not shown here) is coated on the silicon oxide film, and the resist film and the silicon oxide film are etched back completely using the RIE (Reactive Ion Etching) method until the collector layer 11a is exposed to planarize the surface of the substrate 11.

Figure 3E:
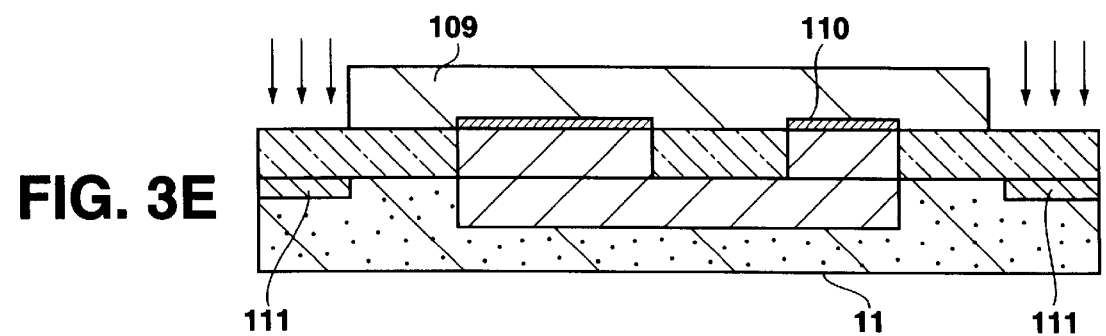

Subsequently, as shown in FIG. 3E, thermal oxidation is carried out at a temperature of about 900° C. to form an oxidized film 110 of about 10 to 30 nm in thickness on the exposed surface of the collector layer 11a formed on the surface of the substrate 11. After this, a resist pattern 109 is formed on the substrate 11, and this resist pattern 109 is used as a mask for ion implantation of P-type impurities to form an isolation region between elements of the bipolar transistor. Then, the resist pattern 109 is removed.

The above processes are the same as the ones in the related art.

The subsequent processes are particular to the manufacturing of the bipolar transistor according to the first embodiment of this invention. The manufacturing procedures are as follows.

At first, as shown in FIG. 4A, a resist pattern 112 is formed on the substrate 11. This resist pattern 112 is formed to have an opening that exposes almost of the entire external base region of the base layer to be formed later. After this, this resist pattern 112 is used as a mask for the RIE to be executed to remove the oxidized film 110, the LOCOS oxidized film 107, and part of the collector layer 11a to a depth of 200 to 300 nm.

Subsequently, the resist pattern 112 is removed as shown in FIG. 4B, and a polysilicon film 113 is formed on the substrate using the CVD method. This polysilicon film 113 contains P-type impurities in a high concentration. Here, the film 113 is formed with a thickness of 200 to 300 nm so that the recess can be filled which is formed with a difference in level on the surface of the substrate 11 by the above etching.

After this, the polysilicon film 113 is polished from the surface side using the CMP (Chemical Mechanical Polishing) process with the oxidized film 110 being used as a stopper to planarize the surface of the substrate 11. With this, the recess of the difference in level is filled with the polysilicon layer 113a.

Next, P-type impurities are diffused in the substrate 11 by thermal diffusion from the polysilicon layer 113a to form a P-type diffused layer 114a along the side periphery of the polysilicon layer 113a. This polysilicon layer 113a and the diffusion layer 114a are used to form a sub base layer 14a.

If the next filming process is to be performed under a high temperature, the diffused layer 114a is formed without particularly carrying out this thermal diffusion process.

Subsequently, as shown in FIG. 4C, the surface of the substrate 11 is cleaned, then the first semiconductor layer 12 is epitaxially grown on the substrate 11 using the MBE (Molecular Beam Epitaxy), gas source MBE, UHV (Ultra High Vacuum)-CVD or LP (Low Pressure)-CVD process. Let this first semiconductor layer 12 be an Si—Ge (silicon-germanium) layer or an Si (silicon) layer containing P-type impurities. After this, in order to keep the surface clean, the second semiconductor 13 is epitaxially grown continuously subsequent to the growth of the first semiconductor layer 12. Let this second semiconductor layer 13 be an Si layer containing N-type impurities. In the above filming process, the first and second semiconductor layers 12 and 13 become single crystal in the portion where single crystal silicon is exposed as a substrate for the growth of the first semiconductor layer 12. On the contrary, on the portion where the substrate for the growth is an oxidized film (LOCOS oxidized film 107) or a polysilicon layer 113a, the first and second semiconductor layers 12 and 13 become microcrystal.

Then, as shown in FIG. 4D, a resist pattern 115 is formed on the second semiconductor layer 13 and this resist pattern 115 is used as a mask for etching the second semiconductor layer 13 to form the emitter layer 13a comprising the second semiconductor layer 13. In this etching, the first semiconductor layer 12 is over-etched and thinned in a part exposed out of the resist pattern 115.

After this, as shown in FIG. 4E, the resist pattern 115 is removed, then a resist pattern 116 is formed so that the pattern 116 can cover the emitter layer 13a and the sub base layer 14a. This resist pattern 116 is used as a mask for etching the first semiconductor 12 to form the base layer 12a comprising the first semiconductor layer 12.

As mentioned above, the collector layer 11a, the base layer 12a, and the emitter 13a are formed, then the resist pattern 116 is removed. After this, as shown in FIG. 2, an insulating film 18 of about 300 nm in thickness is formed on the substrate 11 using the CVD process with the film 18 covering the emitter layer 13a and the base layer 12a. Subsequently, a resist pattern (not shown here) is formed on the insulating film 18 and the pattern is used as a mask for forming contact holes 18a respectively reaching the collector layer 11a, the base layer 12a, and the emitter layer 13a using the RIE method.

Subsequently, the resist pattern is removed and aluminum is sputtered subsequent to spottering of barrier metal (not shown here). After this, the resist pattern (not shown here) is used as a mask for etching (RIE) both aluminum and barrier metal to form wirings 19 connected to the collector layer 11a, the base layer 12a, and the emitter layer 13a, respectively. Then, the resist pattern is removed, followed by a multiple-layer wiring process.

As mentioned above, a bipolar transistor 1, wherein a sub base 14a is disposed under the external base region A, is formed.

For this bipolar transistor 1, the actual film thickness of the external base area A becomes the total film thickness of the external base area A and the sub base layer 14a. Consequently, the increase of the base resistance can be suppressed by the sub base layer 14a disposed under this external base area A even when the first semiconductor layer 12 to be used as the external base region A of the base layer 12a is over-etched for forming the emitter layer 13a shown in FIG. 4D. Furthermore, since the diffused layer 114a that forms the sub base layer 14a is disposed so that it is overlapped with the emitter layer 13a, the external base region A is formed without any gap in the entire region thereof to be able to suppress the base resistance low.

Figure 5:
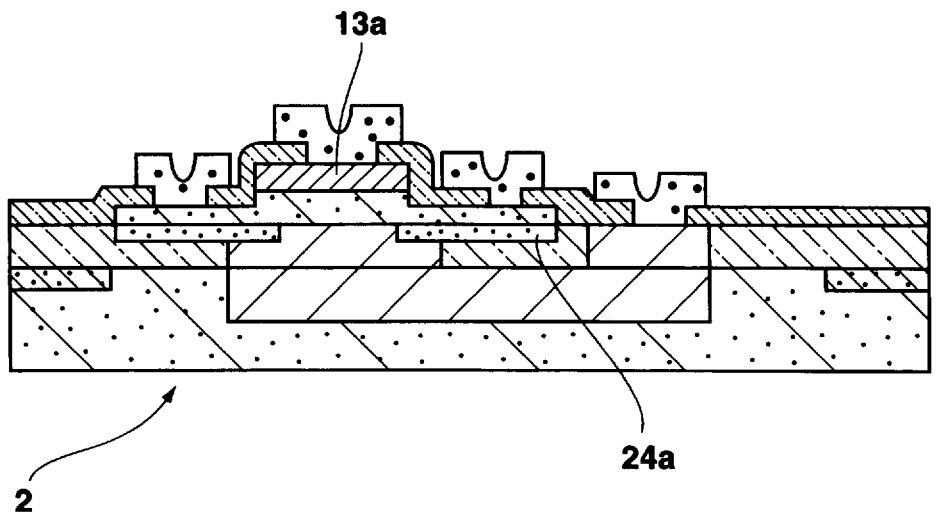
FIG. 5 is a cross sectional view of the bipolar transistor in the second embodiment.

FIG. 5 shows the bipolar transistor 2 in the second embodiment of this invention. The difference between this bipolar transistor 2 and the bipolar transistor 1 in the first embodiment shown in FIG. 2 is only in that the sub base layer 24a in this bipolar transistor 2 comprises only polysilicon layers. And, the sub base layer 24a comprising a polysilicon layer embedded in the surface of the substrate 11 is disposed so that it is overlapped with the emitter layer 13a.

The bipolar transistor in such a configuration is provided with the same effect as that of the bipolar transistor in the first embodiment.

The bipolar transistor 2 is formed without diffusion of impurities from the polysilicon layer 113a shown in FIG. 4B, which was needed in the manufacturing process of the bipolar transistor in the first embodiment.

Figure 6:
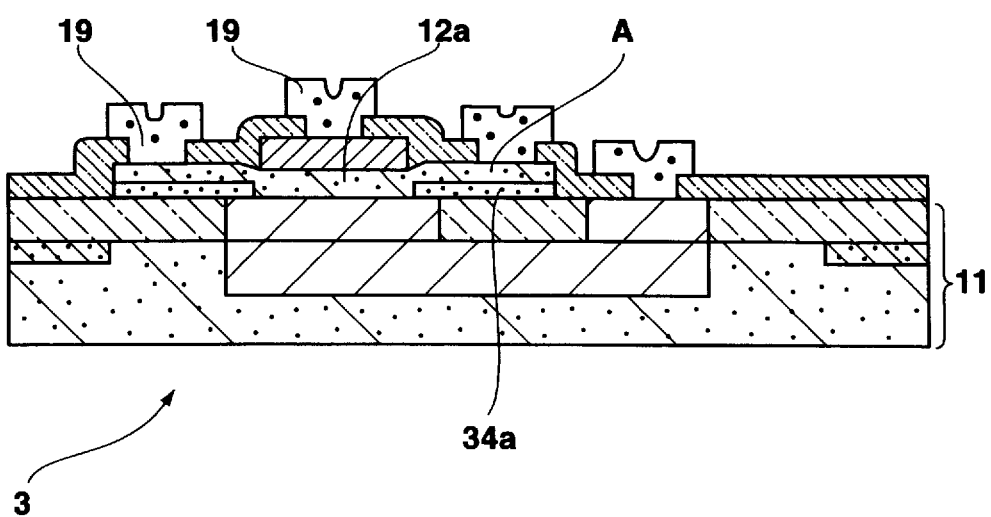
FIG. 6 is a cross sectional view of the bipolar transistor in the third embodiment.

FIG. 6 shows the bipolar transistor 3 in the third embodiment of this invention. The difference between this bipolar transistor 3 and the bipolar transistors 1 and 2 illustrated in FIG. 2 and FIG. 5 is in that the sub base layer 34a disposed under the external base region A of the base layer 12a is disposed on the substrate 11. Hereunder, the process for manufacturing the bipolar transistor 3 will be described.

At first, a collector layer 11a is formed on the surface of the substrate 11 in the procedure shown in FIG. 3A through FIG. 3E in the same way as that of the bipolar transistor in the first embodiment.

Figure 7A:
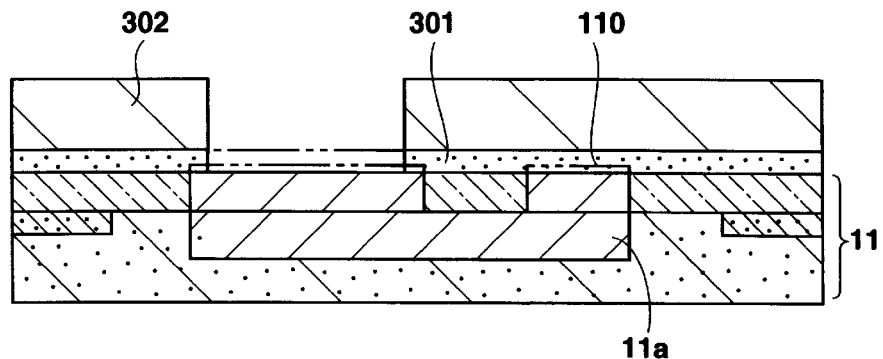
FIG. 7A through FIG. 7D are cross sectional views showing a manufacturing processes of the bipolar transistor in the third embodiment.

Subsequently, as shown in FIG. 7A, the oxidized film 110 on the collector layer 11a is removed and a polysilicon film 301 is formed on the substrate 11 using the CVD process. This polysilicon film 301 contains high concentration of P-type impurities and is formed to have a thickness of 200 to 300 nm. Then, a resist pattern 302 is formed on the polysilicon film 301 so that it has an opening over the junction between the collector layer 11a and the base layer to be formed later. After this, this resist pattern is used as a mask for etching the polysilicon film 301.

Figure 7B:
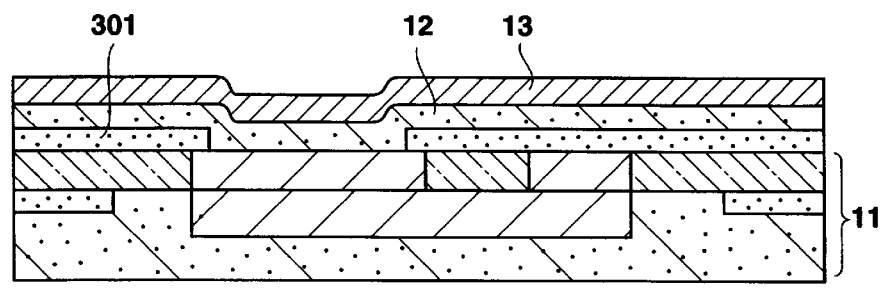

Next, as shown in FIG. 7B, the resist pattern 302 is removed, and then the first semiconductor layer 12 and the second semiconductor layer 13 are formed on the upper surface of the substrate 11 and the polysilicon film 301 in the same way as explained in the first embodiment. This semiconductor layer 12 comprises a Si—Ge layer or Si layer containing P-type impurities.

Figure 7C:
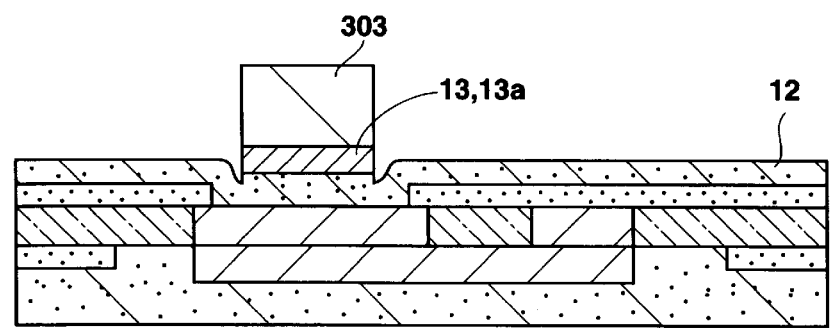

Following this, as shown in FIG. 7C, a resist pattern 303 is formed on the second semiconductor layer 13 and this resist pattern 303 is used as a mask for etching the second semiconductor layer 13. Consequently, the emitter layer 13a comprising the second semiconductor layer 13 is formed. In this etching, the first semiconductor layer 12 exposed out of the resist pattern 303 is over-etched and thinned.

Figure 7D:
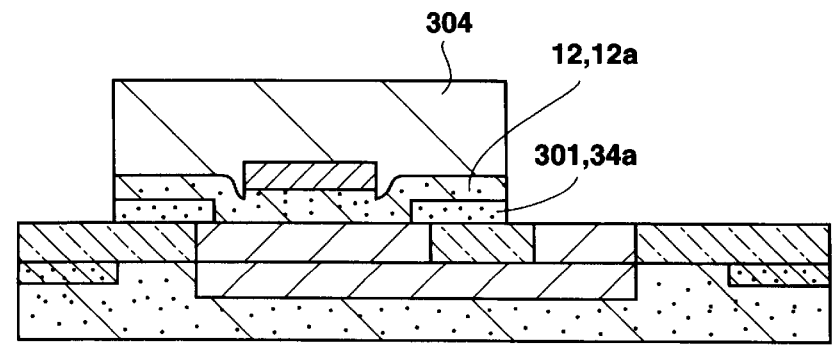

Subsequently, as shown in FIG. 7D, the resist pattern 303 is removed, then a resist pattern 304 is formed to cover the portion where the base layer is to be formed. After this, this resist pattern 304 is used as a mask for etching the first semiconductor layer 12 and the polysilicon film 301 to form the base layer 12a comprising the first semiconductor layer 12 and the sub base layer 34a comprising the polysilicon layer 301.

Hereafter, the same processes as those of the first embodiment are carried out to complete forming of the bipolar transistor shown in FIG. 6.

The bipolar transistor in such a configuration is also provided with the same effect as that of the bipolar transistors in the first and second embodiments mentioned above.

Since the sub base layers of the bipolar transistors shown in the first, second, and third embodiments can be formed regardless of the width of the collector layer 11a, they can be formed without increasing the cell size. Furthermore, in the bipolar transistor in each of the above embodiments with such a configuration, the sub base layer or the sub base layer portion comprising a polysilicon layer may be a layer made of metallic silicide.

Figure 8:
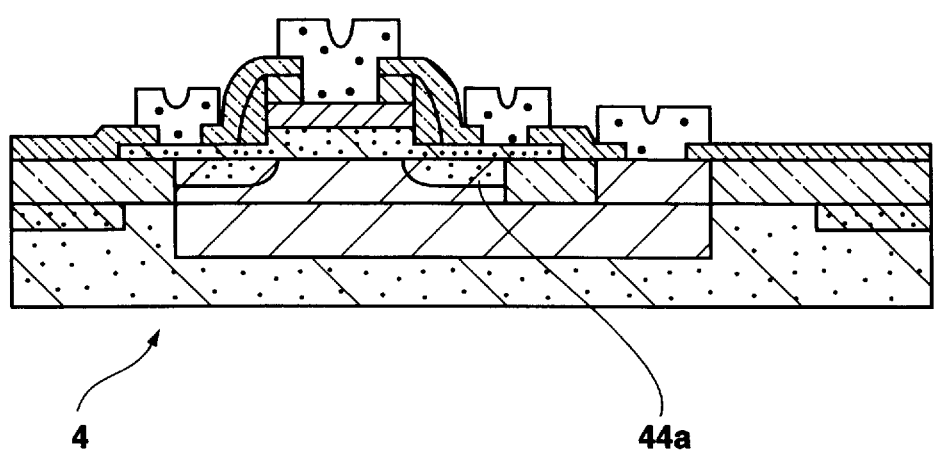
FIG. 8 is a cross sectional view of the bipolar transistor in the fourth embodiment.

FIG. 8 shows the bipolar transistor 4 in the fourth embodiment of this invention. The difference between this bipolar transistor 4 and the bipolar transistors 1, 2 and 3 in the first, second, and third embodiments shown in FIG. 2, FIG. 5, FIG. 6 is in that the sub base layer 44a comprises only a diffused layer. Hereunder, the process for manufacturing the bipolar transistor 4 will be described.

At first, a collector layer 11a is formed on the substrate 11 in the procedures shown in FIG. 3A through FIG. 3E in the same manufacturing way as that of the bipolar transistor in the first embodiment. In this case, however, the collector layer 11a is formed with a width enough to be disposed under the external base region of the base layer to be formed later.

Figure 9A:
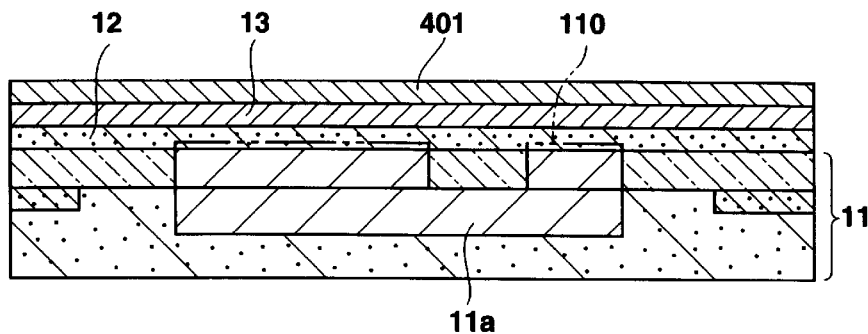
FIG. 9A through FIG. 9D are cross sectional views showing a manufacturing processes of the bipolar transistor in the fourth embodiment.

Subsequently, as shown in FIG. 9A, the oxidized film 110 is removed from the collector layer 11a, then first and second semiconductor layers 12 and 13 are formed on the substrate 11. This first and second semiconductor layers 12 and 13 can be formed just as described in the first embodiment. Then, an oxidized film 401 is formed on the second semiconductor layer 13 using the CVD process with a thickness of 200 to 400 nm.

Figure 9B:
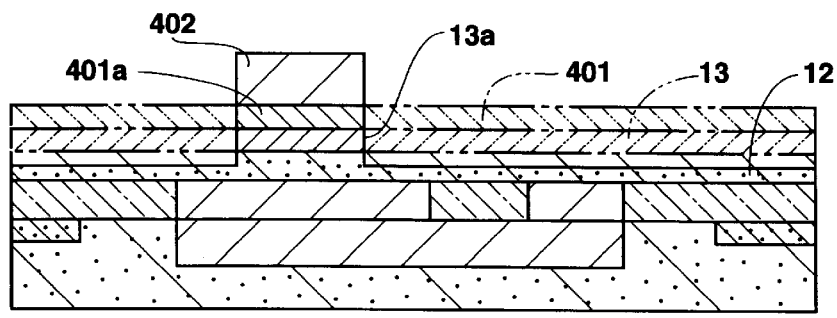

Thereafter, as shown in FIG. 9B, a resist pattern 402 is formed on the oxidized film 401 and this resist pattern 402 is used as a mask for etching the oxidized film 401 and the second semiconductor layer 13 to form an emitter layer 13a comprising the second semiconductor layer 13. On this emitter layer 13 a portion of the oxidized film 401 is left as an offset oxidized film 401a which is used to protect the emitter layer from the ion implantation to be carried out later. In this etching, the first semiconductor layer 12 exposed out of the resist pattern 402 is over-etched and thinned.

Figure 9C:
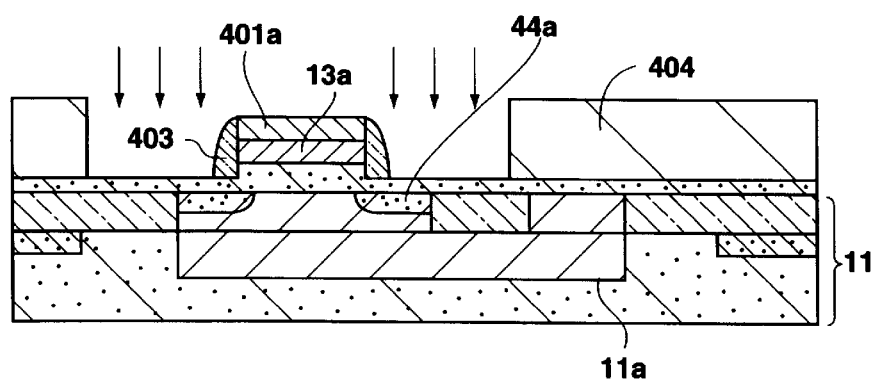

Subsequently, as shown in FIG. 9C, the resist pattern 402 is removed, then a side wall 403 is formed to surround the side surface of the offset oxidized film 401a, the emitter layer 13a, and the first semiconductor layer 12. This side wall 403 is formed by the reactive ion etching of the oxidized film (not shown here) of 200 to 400 nm in thickness that has been formed using the CVD method.

Following this, a resist pattern 404 is formed on the substrate 11 so that it has an opening for exposing at least a portion where the external base region of the base layer to be formed later is to be disposed and covers the portion for external connection of the collector layer 11a. This resist pattern 404 is then used as a mask for ion implantation of P-type impurities into the surface layers of the first semiconductor layer 12 and the substrate 11. Then, the impurities implanted in the surface layer of the substrate 11 form a sub base layer 44a. At this time, for example, boron ion is implanted by $10^{15}$ to $10^{16}$ cm$^{-3}$ with 5 to 50 KeV energy.

Figure 9D:
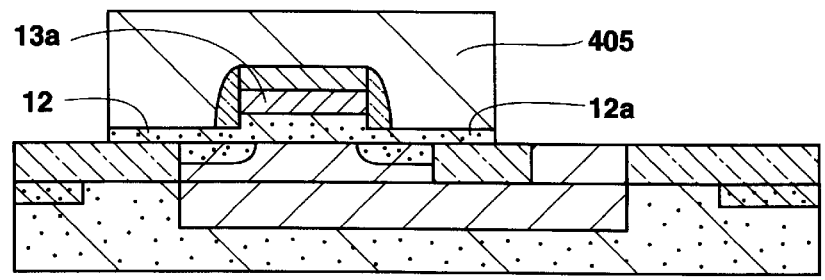

Subsequently, as shown in FIG. 9D, the resist pattern 404 is removed and a resist pattern 405 is formed to cover the portion where the base layer is formed. Then, this resist pattern 405 is used as a mask for etching the first semiconductor 12 to form the base layer 12a comprising the first semiconductor layer 12.

Hereafter, the same processes as those of the first embodiment are carried out to complete the manufacturing of the bipolar transistor 4 shown in FIG. 8.

The bipolar transistor in such a configuration is also provided with the same effect as that of the bipolar transistors in the first, second, and third embodiments.

Figure 10:
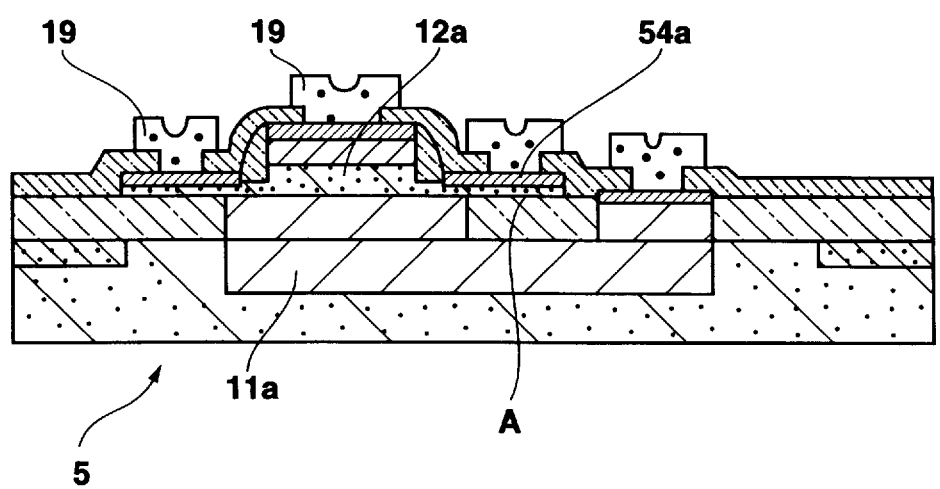
FIG. 10 is a cross sectional view of the bipolar transistor in the fifth embodiment.

FIG. 10 shows the bipolar transistor 5 in the fifth embodiment of this invention. The difference between this bipolar transistor 5 and the bipolar transistors 1 through 4 in the first through fourth embodiments is in that the sub base layer 54a is disposed on the external base region A. Hereunder, the process for manufacturing the bipolar transistor 5 will be described.

At first, a collector layer 11a is formed on the substrate 11 in the procedures shown in FIG. 3A through FIG. 3E in the same manufacturing way as that of any of the bipolar transistors shown in the first through fourth embodiments. In this case, however, the width of the collector layer 11a is determined to be enough to make the layer 11a overlap with the sub base layer to be formed later.

Figure 11A:
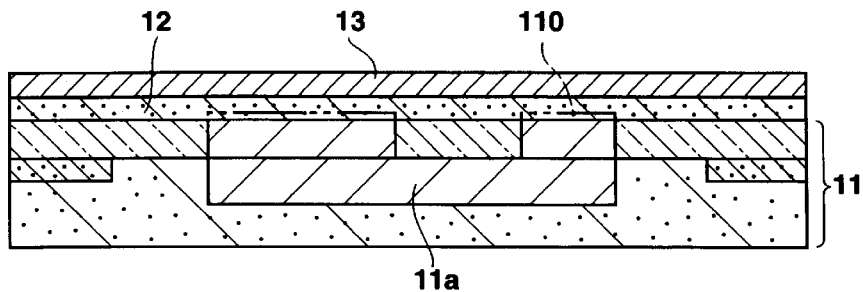
FIG. 11A through FIG. 11E are cross sectional views showing manufacturing processes of the bipolar transistor in the fifth embodiment.

Subsequently, as shown in FIG. 11A, the oxidized film 110 is removed from the collector layer 11a just as described in the first embodiment, and then first and second semiconductor layers 12 and 13 are formed on the substrate 11. This semiconductor layer 12 comprises an Si—Ge layer or an Si layer.

Figure 11B:
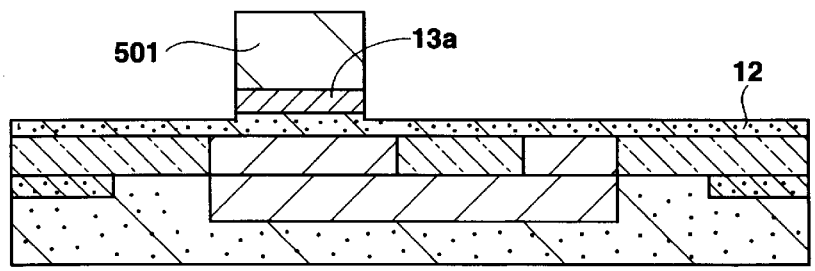

Then, as shown in FIG. 11B, a resist pattern 501 is formed on the second semiconductor layer 13 and this resist pattern 501 is used as a mask for etching the second semiconductor layer 13 to form an emitter layer 13a comprising the second semiconductor layer 13. In this etching, the first semiconductor layer 12 exposed out of the resist pattern 501 is over-etched and thinned.

Figure 11C:
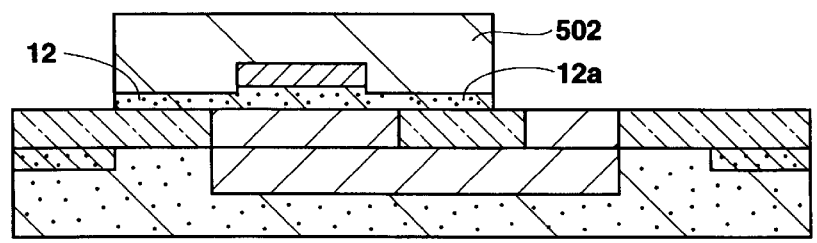

Subsequently, as shown in FIG. 11C, the resist pattern 501 is removed, then a resist pattern 502 is formed to cover the portion where the base layer is to be formed. This resist pattern 502 is then used as a mask for etching the first semiconductor layer 12 to form the base layer 12a comprising the first semiconductor layer 12.

Figure 11D:
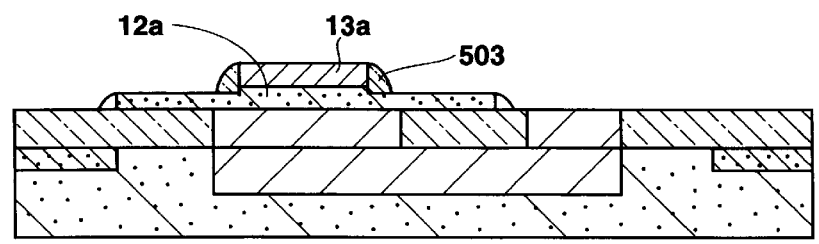

Thereafter, as shown in FIG. 11D, the resist pattern 502 is removed, then a side wall 503 is formed to surround the side surfaces of the emitter layer 13a and the base layer 12a. This side wall 503 is formed by the reactive ion etching of the oxidized film (not shown here) of 200 to 400 nm in thickness which has been formed using the CVD method.

With the side wall 503 being formed, part of the single crystal (that is, the portion on the collector layer 11a) of the base layer 12a is made to be exposed out of the emitter layer 13a and the side wall 503.

Figure 11E:
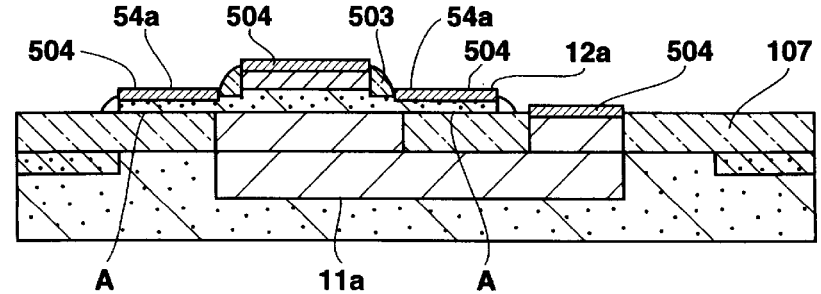

Then, as shown in FIG. 11E, a metallic silicide 504 is grown at the portion exposed out of an oxidized film, that is, a LOCOS-oxidized film 107 and the side wall 503 using a self-aligning silicide process. And, of this metallic silicide 504, the portion grown on the surface of the external base layer region A becomes a sub base layer 54a. One end of this sub base layer 54a is disposed above the collector layer 11a disposed under the base layer 12a, that is, on the single crystal part of the base layer 12a.

Furthermore, a metallic silicide 504 is formed by selectively growing silicide on the surface of Si or Si—Ge by annealing a high melting point metallic film at a temperature of 400° C. to 800° C. which film is previously formed on the substrate 11 by depositing, for example, Ti (titanium), Ni (nickel), Pt (platinum), Mo (molybdenum), Co (cobalt), or Pd (palladium). After the metallic silicide 504 is formed, metallic film on unnecessary part (the part not silicidized) is etched and removed. According to the self-aligning silicide process, a metallic silicide 504 is also grown on the emitter layer 13a. In this case, however, the side wall 503 is used for ensuring an insulation between the metallic silicide 504 portion on the surface of the emitter layer 13a and the sub base layer 54a.

Hereafter, the same processes as those of the first through fourth embodiments are carried out to complete the manufacturing of the bipolar transistor 5 shown in FIG. 10.

A wiring 19 connected to the base layer 12a is formed so that it is connected to the sub base layer 54a.

In the bipolar transistor 5 in such a configuration, a sub base layer 54a formed with metallic silicide whose resistance is extremely low is disposed on the external base region A, thus the bipolar transistor 5 is provided with the same effect as that of the bipolar transistors shown in the first, second, third, and fourth embodiments. Furthermore, since one end of the sub base layer 54a is disposed above the collector layer 11a formed under the base layer 12a, the sub base layer 54a is connected to the single crystal portion of the base layer 12a located on the collector layer 11a. Consequently, the base resistance can be suppressed low.

Figure 12:
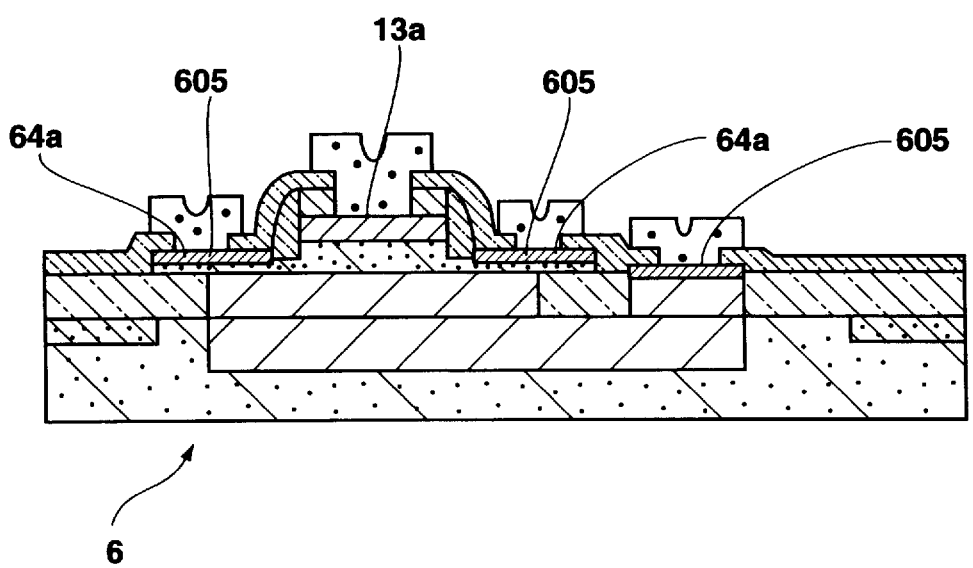
FIG. 12 is a cross sectional view of the bipolar transistor in the sixth embodiment.

FIG. 12 shows the bipolar transistor 6 in the sixth embodiment. The difference between this bipolar transistor 6 and the bipolar transistor 5 in the fifth embodiment is in that the metallic silicide is not disposed on the surface of the emitter layer 13a but only used for forming the sub base layer 64a. Hereunder, the process for manufacturing the bipolar transistor 6 will be described.

At first, an emitter layer 13a is formed on the substrate 11 in the procedures shown in FIG. 3A through FIG. 3E just in the same way as that of the fifth embodiment.

Figure 13A:
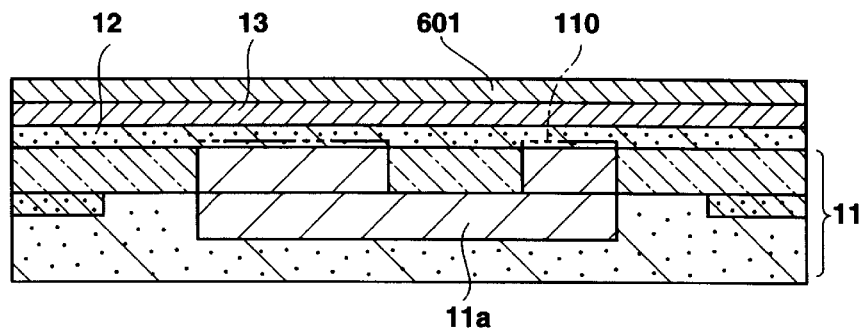
FIG. 13A through FIG. 13E are cross sectional views showing manufacturing processes of the bipolar transistor in the sixth embodiment.
Figure 13B:
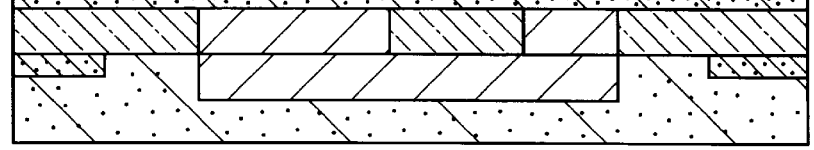
Figure 13C:
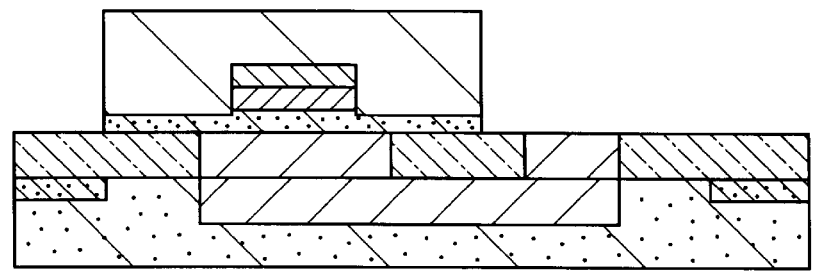
Figure 13D:
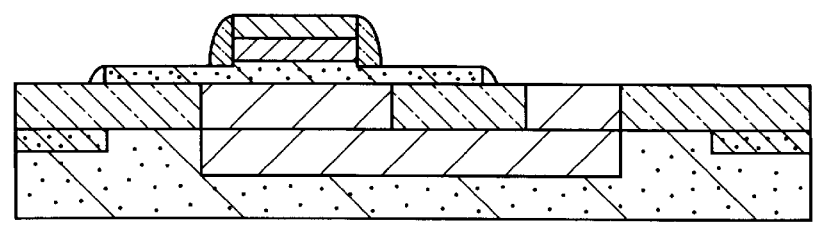
Figure 13E:
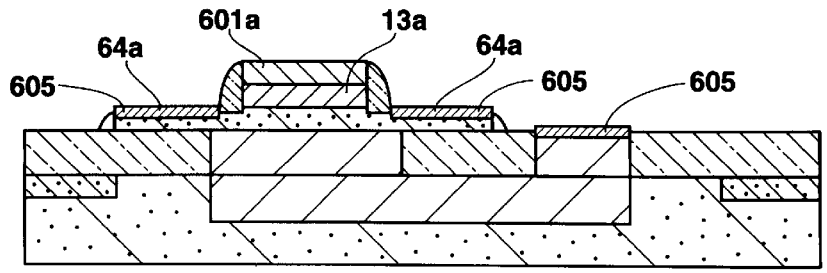

Then, as shown in FIG. 13A, the oxidized film 110 is removed just like in the procedure of the bipolar transistor in the fifth embodiment, then the first and second semiconductor layers 12 and 13 are laminated and filmed on the substrate 11. After this, an oxidized film 601 of 200 to 400 nm in thickness is formed on the second semiconductor layer 13 using the CVD process.

Next, the processes shown in FIG. 13B through FIG. 13E are carried out just like in the processes shown in FIG. 11B through 11E in the manufacturing procedures of the bipolar transistor in the fifth embodiment. With this, in the self-aligning silicide process shown in FIG. 13E, the offset oxidized film 601a comprising the oxidized film 601 is used as a mask to prevent the metallic silicide 605 from being formed on the surface of the emitter layer 13a.

Hereafter, the same processes as those of the first through fifth embodiments are carried out to complete the manufacturing of the bipolar transistor 6 shown in FIG. 12.

In the bipolar transistor 6 in such a configuration, the silicon forming the emitter layer 13a can be prevented from being diffused in the base layer 12a disposed under the emitter layer 13a when metallic silicide is grown on the surface of the emitter layer 13a. Consequently, diffusion of impurities induced by diffusion of the silicon in and under the emitter layer 13a can be prevented, so that the base layer 12a and the emitter layer 13a can be kept shallow.

Figure 14:
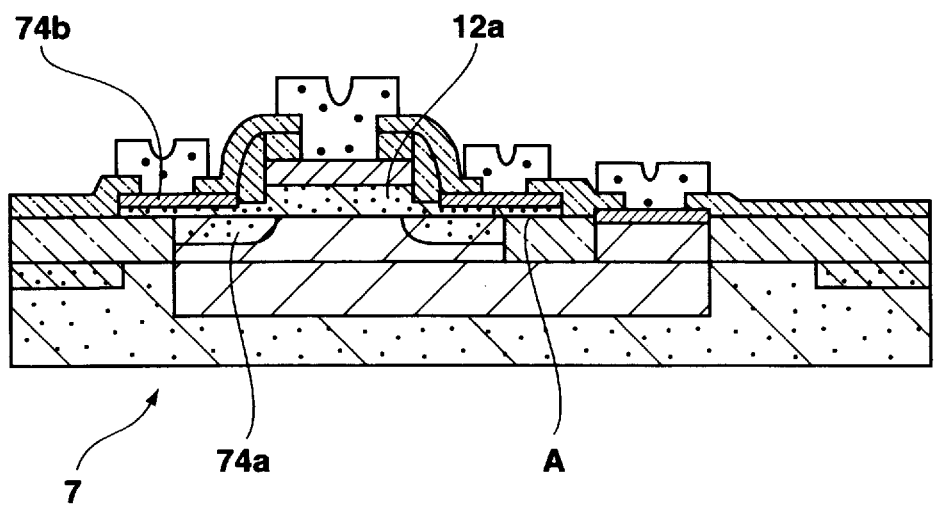
FIG. 14 is a cross sectional view of the bipolar transistor in the seventh embodiment.

FIG. 14 shows the bipolar transistor 7 in the 7th embodiment of this invention. The difference between this bipolar transistor 7 and the bipolar transistor in each of the embodiments shown above is in that the sub base layer 74a is disposed under the external base region A of the base layer 12a and the sub base layer 74b is further disposed on the external base region A.

The bipolar transistor 7 can be formed as shown below, for example. At first, a sub base layer 74a comprising a diffused layer is formed under the external base region A in the procedures shown in FIG. 9A through FIG. 9D in the manufacturing processes of the bipolar transistor in the fourth embodiment. After this, a sub base layer 74b comprising metallic silicide is formed on the external base region A using the self-aligning silicide process shown in the sixth embodiment.

In the bipolar transistor 7, since sub base layers 74a and 74b are disposed on and under the external base layer 12a, base resistance can be reduced much more than that of the bipolar transistor described in each of the first through sixth embodiments.

Figure 15:
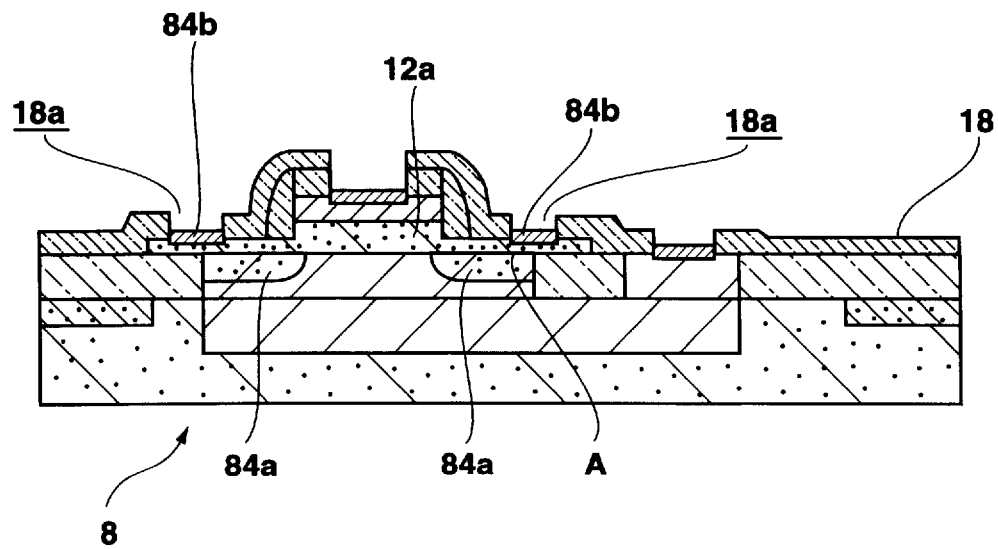
FIG. 15 is a cross sectional view of the bipolar transistor in the eighth embodiment.

Furthermore, FIG. 15 shows the bipolar transistor 8 in the eighth embodiment, which is a variation of the bipolar transistor 7 in the seventh embodiment.

This bipolar transistor 8 can be manufactured in accordance with the procedures shown in FIG. 9A through 9D in the manufacturing process of the bipolar transistor 4 in the fourth embodiment. At first, a sub base layer 84*a* comprising a diffused layer is formed under the external base region A. Then, an insulating film 18 is formed on the substrate 11 and contact holes 18*a* are formed in the insulating film. Each of these contact holes 18*a* must be disposed so that its bottom end comes above the collector layer 11*a* placed under the base layer 12*a*. After this, a sub base layer 84*b* comprising metallic silicide is formed on the external base region A with the self-aligning silicide process shown in the sixth embodiment. Consequently, the sub base layer 84*b* formed in each contact hole 18*a* is disposed on the single crystal portion of the base layer 12*a*.

The bipolar transistor manufactured as described above is also provided with the same effect as that of the bipolar transistor in the 7th embodiment.

In addition to the above manufacturing method, the bipolar transistor wherein a sub base layer is arranged both on and under the external base region A may also be manufactured by combining the manufacturing method of the bipolar transistors described in the first, second, or third embodiments with that of the fifth or sixth embodiments. Each of such bipolar transistors can be manufactured by combining the manufacturing method of a bipolar transistor with that of another.

As described above, according to the bipolar transistor according to the present invention, a sub base layer is disposed both on and under the external base region in the base layer of a mesa bipolar transistor, so that the actual film thickness of the external base region can be increased even when the base film is thinned so as to shallow the junction of the intrinsic base region, and the increase of base resistance can be suppressed. Consequently, high speed operation of the bipolar transistor can be achieved.

What is claimed is:

1. A mesa bipolar transistor, comprising:

a collector layer formed on a surface of a substrate;

a base layer disposed on said substrate so as to be joined to said collector layer;

an emitter layer disposed on said base layer; and a sub base layer comprising at least one of a polysilicon layer containing impurities, a metallic silicide, and a diffused layer formed on a surface layer of said substrate;

said base layer having an external base region as a region lateral to that under said emitter layer, and said sub base layer being disposed under said external base region.

2. A mesa bipolar transistor as defined in claim 1, wherein said base layer comprises a compound semiconductor of silicon and germanium.

3. A mesa bipolar transistor as defined in claim 1, wherein said sub base layer has one end being disposed under said emitter layer.

4. A mesa bipolar transistor, comprising:

a collector layer formed on a surface of a substrate;

a base layer formed on said substrate and being joined to said collector layer;

an emitter layer disposed on said base layer; and a sub base layer disposed on said base layer, said sub base layer comprising a metallic silicide, said base layer having an external base region lateral to that under said emitter layer, and said sub base layer being disposed under said external base region and being insulated from said emitter layer.

5. A mesa bipolar transistor as defined in claim 4, wherein said base layer comprises a compound semiconductor of silicon and germanium.

6. A mesa bipolar transistor as defined in claim 4, wherein said sub base layer has one end being disposed on said collector layer disposed under said base layer.

7. A mesa bipolar transistor as defined in claim 4, wherein the sub base layer comprises at least one of a polysilicon layer containing impurities, a metallic silicide and a diffused layer containing impurities, a metallic silicide and a diffused layer formed on a surface layer on said substrate is disposed under said external base region.

8. A mesa bipolar transistor as defined in claim 7, wherein said sub base layer has one end being disposed under said emitter layer.

9. A mesa bipolar transistor as defined in claim 6, wherein said sub base layer comprises at least one of a polysilicon layer containing impurities, a metallic silicide and a diffused layer formed on a surface layer of said substrate, and is disposed under said external base region.

10. A mesa bipolar transistor as defined in claim 9, wherein said sub base layer has one end being disposed under said emitter layer.

* * * * *